US006940222B2

(12) United States Patent
Sakurai

(10) Patent No.: US 6,940,222 B2
(45) Date of Patent: Sep. 6, 2005

(54) SELF-EMITTING DISPLAY APPARATUS HAVING VARIABLE LIGHT EMISSION AREA

(75) Inventor: Hiroyuki Sakurai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 10/246,467

(22) Filed: Sep. 19, 2002

(65) Prior Publication Data

US 2003/0052597 A1 Mar. 20, 2003

(30) Foreign Application Priority Data

Sep. 19, 2001 (JP) ....................................... 2001-284318

(51) Int. Cl.[7] ............................. H05B 33/14; H01J 1/62
(52) U.S. Cl. ..................... 313/500; 313/504; 315/169.1
(58) Field of Search ................................ 313/498, 500, 313/504, 506, 505; 315/169.3, 169.1; 428/690, 917; 345/77

(56) References Cited

U.S. PATENT DOCUMENTS 6,366,025 B1 * 4/2002 Yamada .................. 315/169.3
6,747,618 B2 * 6/2004 Arnold et al. ................ 345/77
6,801,000 B2 * 10/2004 Jongman et al. ......... 315/169.1
2002/0014837 A1 * 2/2002 Kim et al. .................. 313/505

FOREIGN PATENT DOCUMENTS

EP 1032045 A2 * 8/2000 ........... H01L/27/15

* cited by examiner

*Primary Examiner*—Karabi Guharay
(74) *Attorney, Agent, or Firm*—Oblon, Spivak, McClelland, Maier & Neustadt, P.C.

(57) ABSTRACT

A self-emitting display apparatus has a plurality of display pixels arranged in a matrix. Each display pixel includes a plurality of kinds of self-emitting devices that self-emit light components with different major wavelengths. A light-emission area of at least one of the plurality of kinds of self-emitting devices differs from each of light-emission areas of the other self-emitting devices.

8 Claims, 5 Drawing Sheets

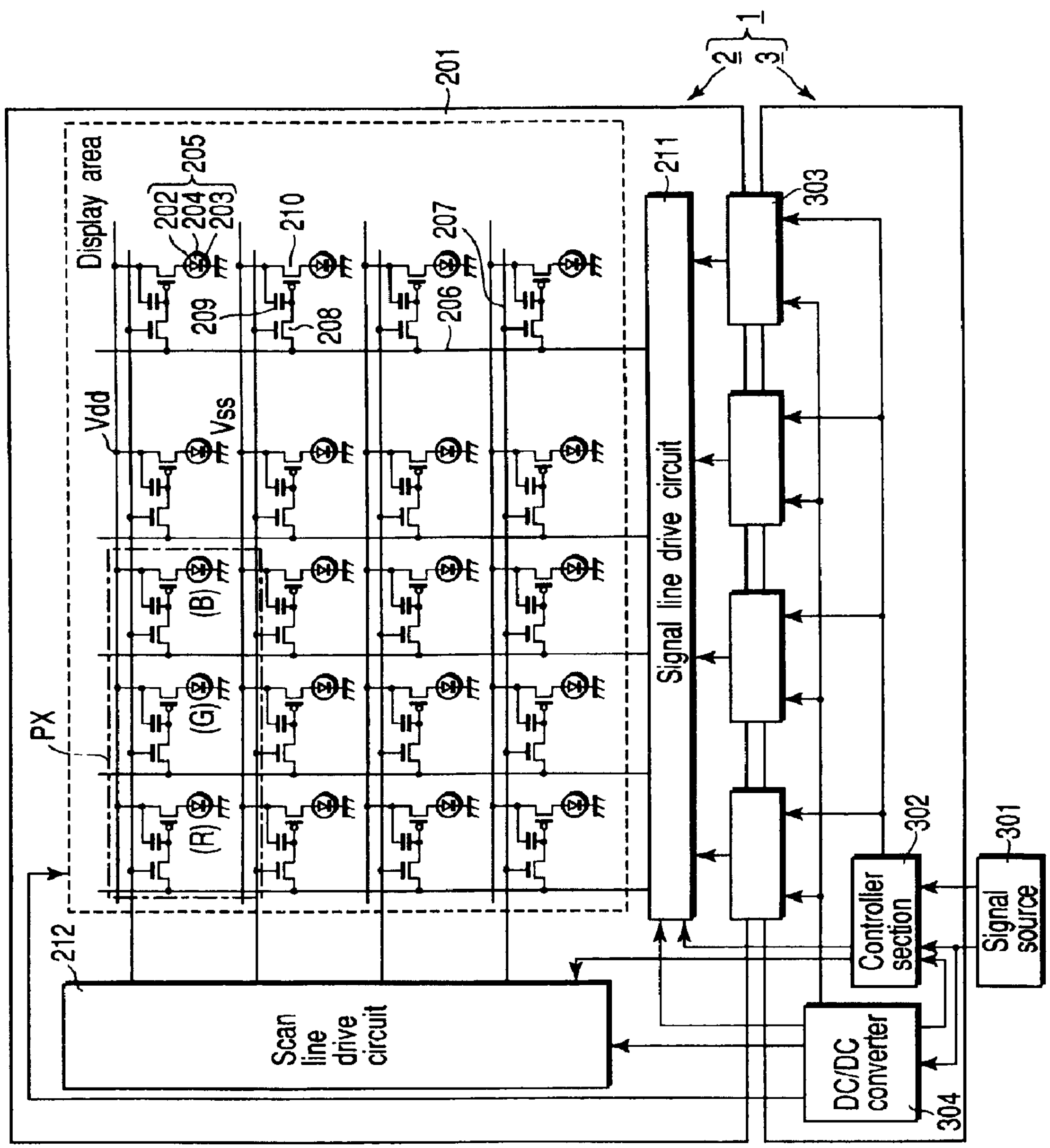
F I G. 1

SELF-EMITTING DISPLAY APPARATUS HAVING VARIABLE LIGHT EMISSION AREA

CROSS-REFERENCE TO RELATED APPLICATIONS

This application is based upon and claims the benefit of priority from the prior Japanese Patent Application No. 2001-284318, filed Sep. 19, 2001, the entire contents of which are incorporated herein by reference.

BACKGROUND OF THE INVENTION

1. Field of the Invention

The present invention relates generally to a self-emitting display apparatus, and more particularly to a self-emitting display apparatus having a plurality of kinds of self-emitting devices and being capable of displaying color images.

2. Description of the Related Art

Recently, organic electroluminescence (EL) display apparatuses have widely been developed as self-emitting display apparatuses which can achieve quicker response and provide a wider angle of view field than liquid crystal display apparatuses. The organic EL display apparatus comprises a plurality of organic EL display devices each having a switching element. Each organic EL display device (hereinafter referred to as "display device") is constructed such that a light-emission layer serving as an optical modulation layer is interposed between a pair of electrodes.

The organic EL display apparatus that displays a color image comprises light-emission layers that emit different color light associated with each display device. For example, the light-emission layers of the respective display devices are formed of luminous materials associated with red (R), green (G) and blue (B). The red, green and blue luminous materials, of which the light-emission layers are formed, have different light-emission characteristics associated with the respective colors.

In particular, in the case of typical high-molecular weight organic EL materials, which have been used in recent developments, when a current density (i.e. a value obtained by dividing a current applied to the device by a light-emission area) is equal in the red, green and blue display devices, the luminance half-value period (i.e. the period within which the luminance of the display device decreases to ½) of the blue display device is shortest. Since the degradation of the blue display device is earlier than the other color display devices, that is, the red and green display devices, the white balance will be lost with the passing of time. If the loss of white balance is conspicuous, a white image, when displayed, may have a yellowish component.

In order to maintain a constant white balance in a display apparatus wherein the respective color display devices have equal areas, it is necessary to control the current amount for each color. However, if the current amount for the blue display device is decreased, the luminance lowers and the display quality will considerably deteriorate.

BRIEF SUMMARY OF THE INVENTION

The present invention has been made to solve the above technical problem, and an object thereof is to provide a self-emitting display apparatus capable of suppressing a conspicuous variance in white balance with the passing of time.

Another object of the invention is to provide a highly reliable self-emitting display apparatus capable of displaying a good color image.

According to an aspect of the invention, there is provided a self-emitting display apparatus having a plurality of display pixels arranged in a matrix, each display pixel including a plurality of kinds of self-emitting devices that self-emit light components with different major wavelengths, wherein a light-emission area of one of the plurality of kinds of self-emitting devices, which has a shortest luminance half-value period relative to an equivalent current density, is larger than a light-emission area of another of the plurality of kinds of self-emitting devices, which has a longest luminance half-value period relative to the equivalent current density.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 schematically shows the structure of an organic EL display apparatus according to an embodiment of the present invention;

DETAILED DESCRIPTION OF THE INVENTION

Figure 2:
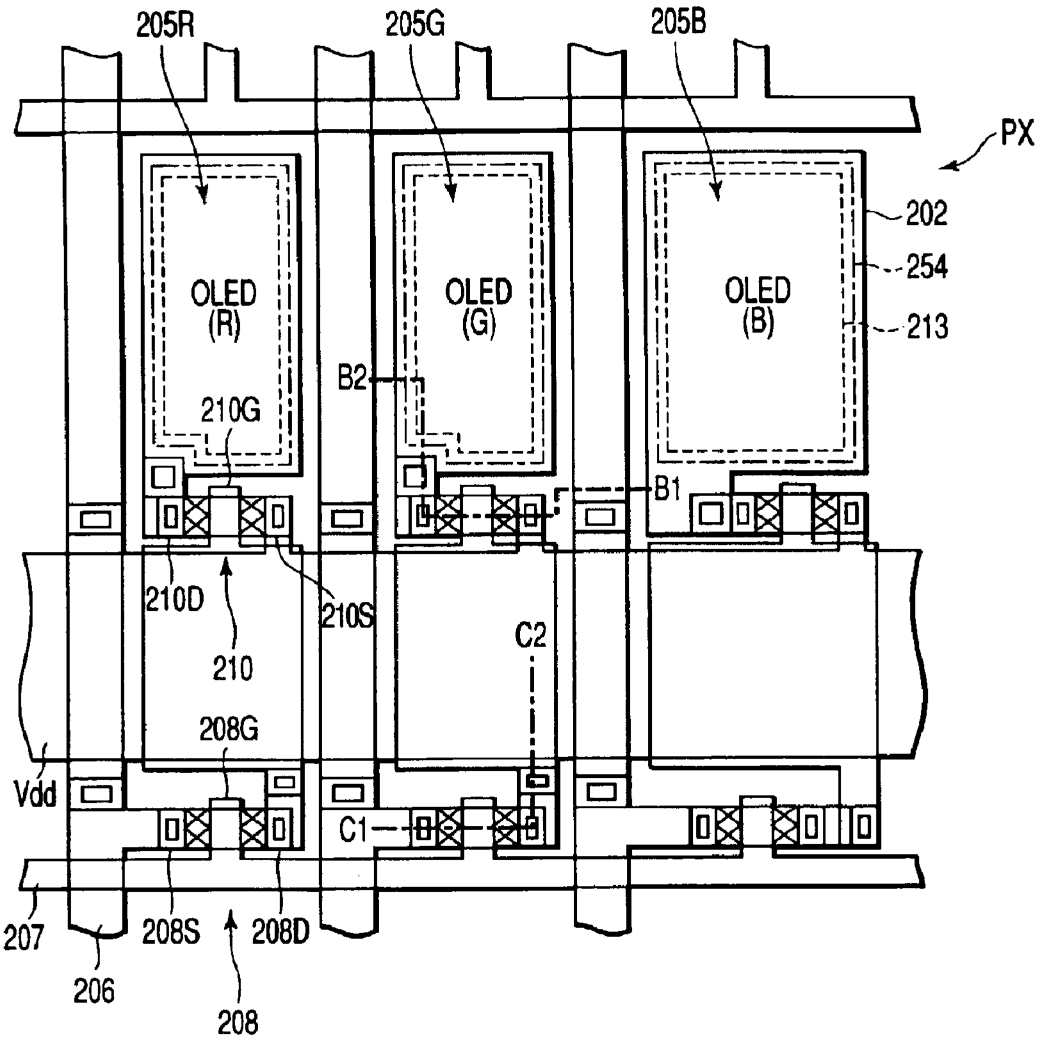
FIG. 2 is a plan view schematically showing a display pixel PX on the display area of the organic EL display apparatus shown in FIG. 1.

An organic EL display apparatus, as a self-emitting display apparatus according to an embodiment of the invention, will now be described in detail with reference to the accompanying drawings.

As is shown in FIG. 1, an organic EL display apparatus 1 comprises an organic EL panel 2 and an external drive circuit 3 which drives the organic EL panel 2. The organic EL panel 2 includes a display area and a drive circuit area on a support substrate 201 formed of, e.g. glass. The display area comprises a plurality of display pixels PX arranged in a matrix. Each display pixel PX comprises a plurality of kinds of organic EL display devices (hereinafter referred to as "display devices") 205 serving as self-emitting devices. The drive circuit area includes drive circuits for driving the respective display devices 205 on the basis of signals from the external drive circuit 3.

The display area of organic EL panel 2 will now be described in greater detail. In this embodiment, the organic EL panel 2 has a 10.4-inch display area. Video signal lines 206 and scan signal lines 207 intersect with each other and are arrayed on the support substrate 201 with insulating properties. An n-channel TFT serving as a switching element 208, a capacitor 209 for storing a video signal voltage, and a p-channel TFT serving as a driving control element 210 are surrounded by the video signal lines 206 and scan signal lines 207. One display device 205 of the display pixel PX is surrounded by the video signal lines 206 and scan signal lines 207.

The display device 205 comprises a first electrode 202, which is formed of a light reflective electrically conductive film connected to the driving control element 210, an organic light-emission layer 204 provided on the first electrode 202, and a second electrode 203 disposed opposed to the first electrode 202 with the organic light-emission layer 204 interposed. The organic light emission layer 204 may have a three-layer structure comprising a hole transport layer and an electron transport layer, which are formed commonly for all colors, and a light-emission layer formed individually for each color. Alternatively, the organic light emission layer 204 may comprise functionally integrated two layers or a functionally integrated single layer.

The drive circuit area of organic EL panel 2 includes a signal line drive circuit 211 and a scan line drive circuit 212. The signal line drive circuit 211 outputs drive signals for driving the video signal lines 206, and the scan line drive circuit 212 outputs drive signals for driving the scan signal lines 207. The signal line drive circuit 211 and scan line drive circuit 212 are formed on the support substrate 201 on which the switching elements 208, etc. are formed. The switching elements 208, driving control elements 210, signal line drive circuit 211 and scan line drive circuit 212 are formed of thin-film transistors using polysilicon for their semiconductor layers, and these are formed through the same steps.

The signal line drive circuit 211 supplies analog video signals from the external drive circuit 3 to associated video signal lines 206 in a sampling manner. The scan line drive circuit 212 controls the switching elements 208 in units of a row. Thereby, the display device 205 associated with each switching element 208 is driven.

The external drive circuit 3 will now be described in greater detail.

The external drive circuit 3 comprises a controller section 302, DA converters 303, and a DC/DC converter 304. The controller section 302 and DC/DC converter 304 are driven by a power supply voltage supplied from a signal source 301 of, e.g. a personal computer.

The controller section 302 receives data including digital video signals from the signal source 301. The controller section 302 produces control signals for driving the organic EL panel 2, and performs digital processing such as rearrangement of digital video signals. Specifically, the controller section 302 produces control signals such as an X-axis sync signal for controlling the signal line drive circuit 211, and a Y-axis sync signal for controlling the scan line drive circuit 212. The controller section 302 delivers the digitized video signals to the DA converters 303.

The DA converter 303 converts the digital video signal from the controller section 302 to an analog video signal. The DC/DC converter 304 produces a power supply voltage, which drives the controller section 302 and DA converters 303, from the power supply voltage provided by the signal source 301. The DC/DC converter 304 generates an X-side power supply for driving the signal line drive circuit 211, a Y-side power supply for driving the scan line drive circuit 211, and a drive power supply provided to a current supply line Vdd for driving the display devices 205.

The DC/DC converter 304 and controller section 302 are disposed on a PCB (Printed Circuit Board). The DA converters 303 are disposed in an IC form on a flexible wiring board as a TCP (Taper Carrier Package).

The display area will now be described in greater detail.

Figure 3:
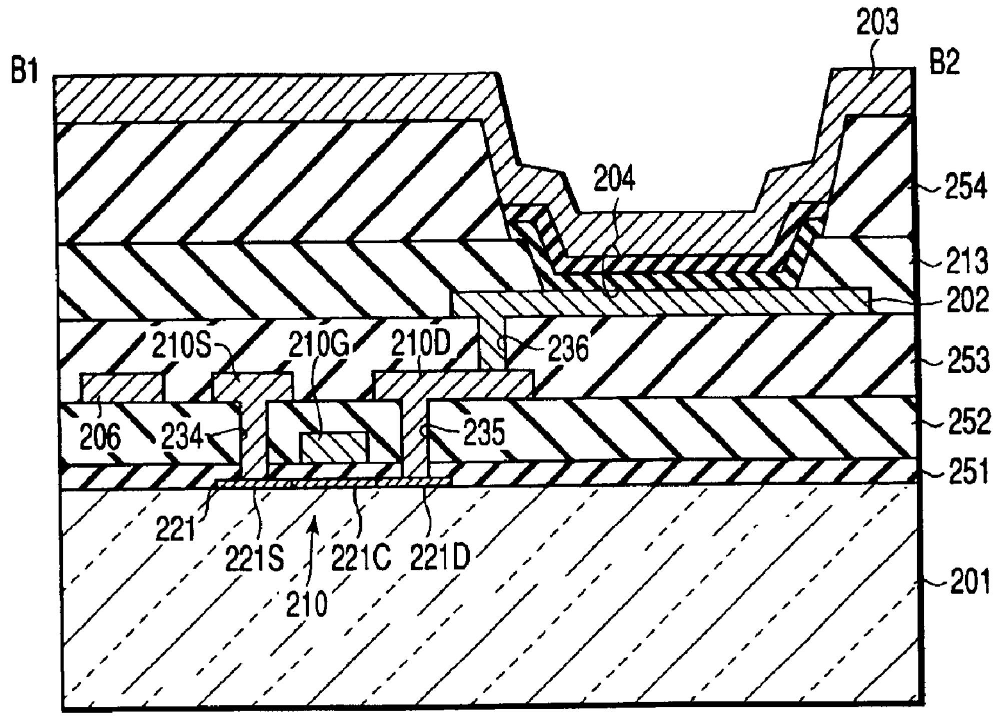
FIG. 3 is a cross-sectional view schematically showing a cross-sectional structure of the display area shown in FIG. 2, taken along line B1–B2 in FIG. 2.
Figure 4:
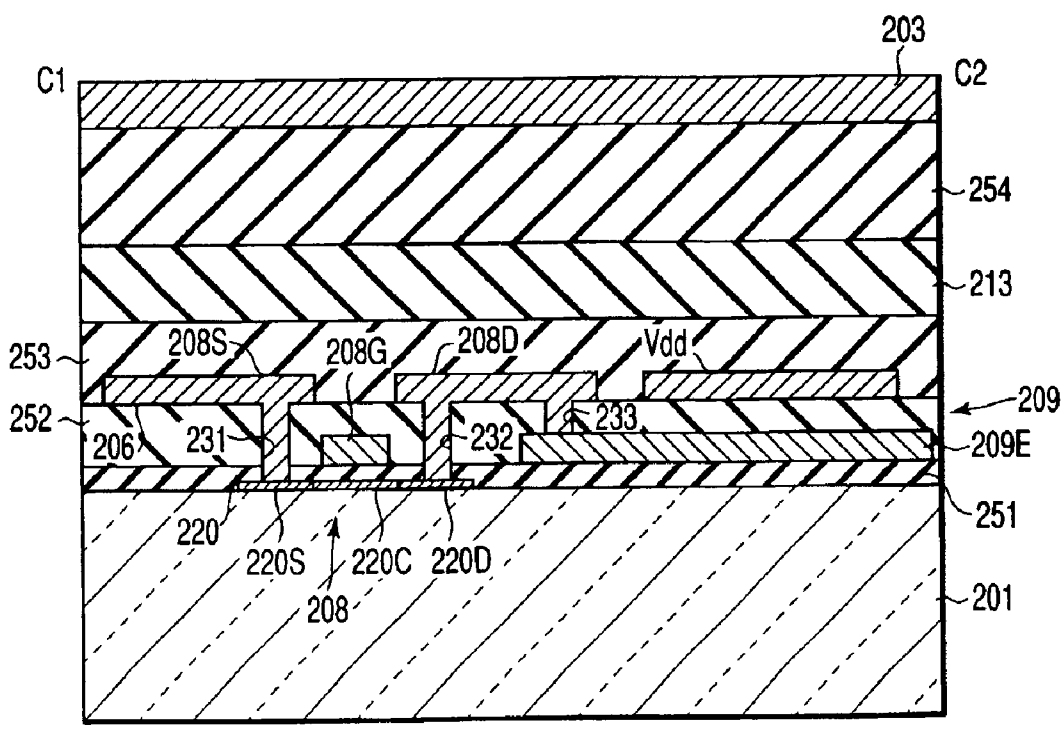
FIG. 4 is a cross-sectional view schematically showing a cross-sectional structure of the display area shown in FIG. 2, taken along line C1–C2 in FIG. 2.

As is shown in FIGS. 2 to 4, one display pixel PX comprises a plurality of kinds of display devices 205, for example, a red display device (first self-emitting device) 205R that emits red light, a green display device (second self-emitting device) 205G that emits green light, and a blue display device (third self-emitting device) 205B that emits blue light.

In each display device 205, a polysilicon film 220 of the switching element 208 and a polysilicon film 221 of the driving control element 210 are provided on the support substrate 201 and are covered with a gate insulating film 251. The polysilicon film 220 comprises a source region 220S, a drain region 220D and an n-channel region 220C therebetween. The polysilicon film 221 comprises a source region 221S, a drain region 221D and a p-channel region 221C therebetween.

A gate electrode 208G of the switching element 208, a gate electrode 210G of the driving control element 210 and an electrode portion 209E for the capacitor 209 are provided on the gate insulating film 251 and are covered with an interlayer insulating film 252. The gate electrode 208G is formed integral with the scan signal line 207. The gate electrode 210G is formed integral with the electrode portion 209E.

A source electrode 208S and a drain electrode 208D of the switching element 208 are provided on the interlayer insulating film 252 and are covered with a protection film 253. The source electrode 208S is formed integral with the video signal line 206. The source electrode 208S is put in contact with the source region 220S of polysilicon film 220 via a contact hole 231 that penetrates the gate insulating film 251 and interlayer insulating film 252. The drain electrode 208D is put in contact with the drain region 220D of polysilicon film 220 via a contact hole 232 that penetrates the gate insulating film 251 and interlayer insulating film 252. The drain electrode 208D is also put in contact with the electrode portion 209E via a contact hole 233 that penetrates the interlayer insulating film 252.

A source electrode 210S and a drain electrode 210D of the driving control element 210 are provided on the interlayer insulating film 252 and are covered with the protection film 253. The source electrode 210S is formed integral with the current supply line Vdd. The source electrode 210S is put in contact with the source region 221S of polysilicon film 221 via a contact hole 234 that penetrates the gate insulating film 251 and interlayer insulating film 252. The drain electrode 210D is put in contact with the drain region 221D of polysilicon film 221 via a contact hole 235 that penetrates the gate insulating film 251 and interlayer insulating film 252.

The first electrode 202 is provided on the protection film 253, and a peripheral portion thereof is covered with a hydrophilic film 213. The first electrode 202 is put in contact with the drain electrode 210D via a contact hole 236 that penetrates the protection film 253. A partition film 254 is provided on the hydrophilic film 213 and partitions each display device 205. The organic light-emission layer 204 is disposed on the first electrode 202 and insulated from adjacent display devices 205 by the partition film 254. The organic light-emission layer 204 may comprise a single layer or a plurality of layers. The second electrode 203 is disposed on the organic light-emission layer 204 and partition film 254 and provided commonly for a plurality of display devices 205.

The display devices 205 (R, G, B) have organic light-emission layers 204 that emit red, green and blue light, respectively. In this embodiment, the organic light-emission layers 204 are formed of, e.g. polyfluorene high-molecular weight materials.

As is shown in FIG. 2, in this organic EL display apparatus 1, the sizes of light-emission areas of the respective display devices 205 are determined in accordance with colors, i.e. red, green and blue. For example, when the light-emission area of the red display device 205R is 1, the ratio between (light-emission area of red display device 205R):(light-emission area of green display device 205G):(light-emission area of blue display device 205B)=1:1:2.

The luminous materials that emit respective colors have different degrees of degradation relative to the same current density with the passing of time. Thus, there are a color with a less decrease in luminance and a color with a more decrease in luminance within the same light emission period. If the difference in luminance between the respective colors is large, the luminance mixture ratio varies considerably and a visually recognizable degradation occurs in the white balance.

The present invention has been made in consideration of the above problem. In this invention, the degree of decrease in luminance of each color within the same light emission period is optimized, the variation in luminance mixture ratio is suppressed, and the variation in white balance is decreased. Thereby, the reliability in display is maintained and high-quality color images can be displayed for a long time period. In other words, major wavelength light components constituting a color image are emitted from a plural kinds of display devices. In this case, it is desirable that the degree of decrease in luminance of the display devices with the passing of time be substantially equal between the respective colors. If the degree of decrease in luminance of the respective colors is substantially equal, the luminance mixture ratio of the colors does not greatly vary within the same light emission period, and a variation in white balance can be suppressed for a long time period.

Figure 6:
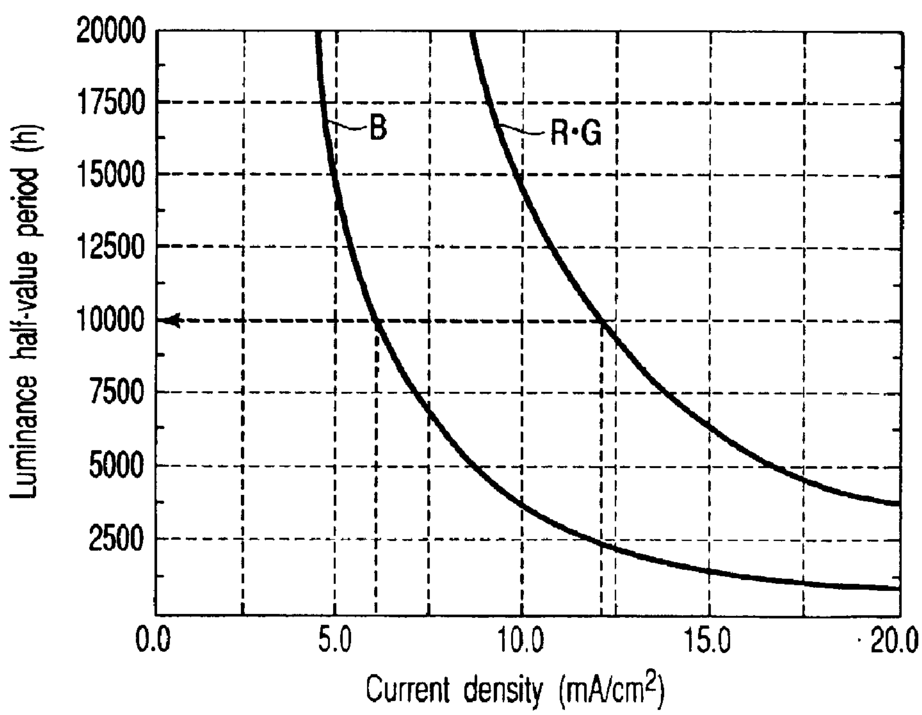
FIG. 6 is a characteristic graph showing an example of the relationship between the current density and luminance half-value period in the respective color display devices.

In this invention, attention has been paid to the fact that the luminance half-value period depends on the current density in the display device 205, and the fact that the luminous material that emits each color has inherent current density vs. luminance half-value period characteristics. Specifically, when the current density is the same, a pixel area having a shortest luminance half-value period is made larger than a pixel area having a longest luminance half-value period. Thereby, the current densities of the respective display devices are set such that the luminance half-value periods of the luminous materials of the display devices 205 (R, G, B) may not considerably vary, and preferably may become substantially equal. Most preferably, the light-emission areas may be determined based on the current densities of the respective display devices so that their luminance half-value periods may become substantially equal in the current density vs. luminance half-value period characteristics in FIG. 6. For example, when the drive current is equal for RGB, current densities, with which the luminance half-value periods of the RGB devices may substantially equal in FIG. 6, are found. Then, the light-emission areas may be determined in inverse proportion to these current densities (when the current density is double, for instance, the optimal device area is set at ½). As regards a display device having an intermediate luminance half-value period between the maximum and minimum luminance half-value periods of the other devices, the pixel area thereof is similarly adjusted and thus the white balance may be kept. Desirable current densities of the respective display devices 205 (R, G, B) can be obtained by adjusting the light-emission areas of the display devices 205 (R, G, B) in accordance with current values that realize predetermined luminances at the stage of designing (or at the time of start of driving). In other words, the light-emission areas of the display devices 205 (R, G, B) are determined based on the current density vs. luminance half-value period characteristics of the luminous materials of the light-emission layers 204 of display devices 205.

The luminance half-value period of the display device using a luminous material that degrades relatively earlier can be increased by increasing the light-emission area and thus decreasing the current density. Thereby, the degree of decrease in luminance can be reduced. On the other hand, when the life of the display device using a luminous material that degrades relatively later is made closer to that of the display device using a luminous material that degrades relatively earlier, the light-emission area is decreased so as to increase the current density. Thereby, the luminance half-value period can be decreased, and the degree of decrease in luminance can be increased. In this manner, the light-emission areas of the respective display devices are adjusted so that desired current densities may be obtained and the luminance half-value periods optimized.

Accordingly, when desired currents are supplied to the display devices 205 (R, G, B), a good white balance is obtained at the time of start of driving. If desired constant currents are continuously supplied to the display devices 205 (R, G, B), the luminance of each display device 205 (R, G, B) decreases with the passing of time. However, since the degree of decrease in luminance of each color is substantially equal, the variation in luminance mixture ratio of the respective colors can be limited within a tolerable range, that is, the degradation in white balance can be suppressed to a visually unrecognizable level. Therefore, a good white balance can be maintained and high-quality color images can be displayed for a long time period.

The light-emission area in this context refers to that area of each display device 205 (R, G, B), which substantially contributes to light emission. In this embodiment, the light-emission area corresponds to that area of the first electrode 202, which is exposed from the hydrophilic film 213 (that is, the area of contact between the first electrode 202 and organic light-emission layer 204).

The luminance half-value period in this context refers to a light-emission time period at which the luminance of the display device 205 has decreased to half the luminance thereof at the start of driving, following the continuous driving of the display device 205 with a constant current density. In this embodiment, the luminance half-value period is measured by using a luminance meter while a constant current is let to flow in a display device in a dark room.

FIG. 6 shows an example of the relationship between the current density and luminance half-value period of the display device. As is shown in FIG. 6, the luminance half-value period depends on the density of current flowing in the display device 205. In the example of FIG. 6, a red luminous material and a green luminous material have the same current density vs. luminance half-value period characteristics, and a blue luminous material has characteristics different from those of them. In this example, in order that the luminance half-value period may be 10,000 hours or more, it is necessary that the current density for the blue luminous material be 6.0 $mA/cm^2$ or less, and the current density for the red and green luminous materials be 12.0 $mA/cm^2$ or less.

In this embodiment, the pixel pitch was set at 300 $\mu$m, and the current applied to one display device at 0.9 $\mu$A. This current value is not absolute. A display device for a TV display or a PC monitor requires a high surface luminance, and accordingly a high drive current. On the other hand, a display device for a mobile phone requires only about ½ to ⅙ the current value for the display device for TV.

For the purpose of simple description, assume that the light-emission efficiency (cd/A) of each color luminous material is constant independently from the current density. For example, the light-emission areas of the red, green and blue display devices are set at 25%, 25% and 50% of the area surrounded by the video signal lines 206 and scan signal lines 207. Thereby, the current density in the blue display device was successfully be set at 6.0 $mA/cm^2$, and the current density in the red and green display devices at 12.0 $mA/cm^2$. Thereby, the luminance half-value period of each of the display devices of all colors can reach 10,000 hours, with the white valance remains unchanged.

In short, the current density is set for each color so that the luminance half-value period may reach a predetermined time period. Thus, the light-emission area of the display device is based on the current value for obtaining a desired luminance, thereby to obtain a predetermined current density. Hence, the light-emission areas of the display devices are varied according to selected luminous materials.

However, if it is assumed that the light-emission efficiency of each luminous material is constant irrespective of the current density, the luminances of the respective display devices 205 (R, G, B) in the same light-emission period become equal when the same current amount is supplied to the display devices 205 (R, G, B). In this way, the light-emission areas of the display devices 205 (R, G, B) are properly set on the basis of the current density vs. luminance half-value period characteristics of the luminous material, whereby the current density can be optimized without lowering the luminance of each display device 205 (R, G, B) and a highly reliable organic EL display apparatus 1 can be realized.

Moreover, since the luminance half-value periods for the respective colors can be made substantially equal, the life of each display device (R, G, B) can be made substantially equal.

Figure 5:
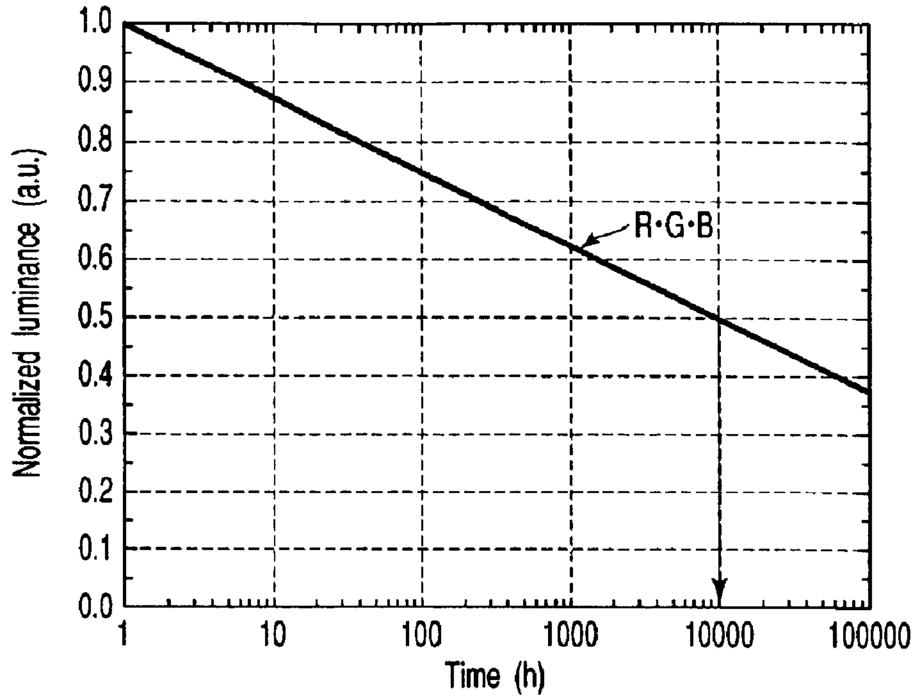
FIG. 5 is a characteristic graph showing an example of the relationship between the light emission time and normalized luminance in the respective color display devices.

Since the current densities for the respective colors are optimized by adjusting the light-emission areas, the luminance mixture ratio of the respective colors is unchanged, as shown in FIG. 5, and the variation in white balance can be suppressed.

In the above embodiment, the light-emission area of the blue display device is greater than that of each of the other display devices. However, as described above, the light-emission area of each display device is determined based on the current density vs. luminance half-value period characteristics of the chosen luminous material. Thus, depending on the kind of the chosen luminous material, the light-emission area of the display device for a color other than blue may be larger. In general, the life of the display device is shorter, as it emits a shorter wavelength light. It is thus desirable that the light-emission area of the display device that emits a shorter wavelength light such as blue be increased, thereby to decrease the current density. Luminous materials include low-molecular weight materials and high-molecular weight materials. In particular, some of the high-molecular weight materials, which emit shorter wavelength light (e.g. blue), have a greater degree of degradation in luminance with the passing of time. On the other hand, some of the low-molecular weight materials, which emit longer wavelength light (e.g. red), have a greater degree of degradation in luminance with the passing of time. As stated above, the light-emission area of a display device, which uses a luminous material with a higher degree of degradation in luminance, is made greater than that of the other display device.

In the above-described embodiment, the organic EL display apparatus 1 has been described as the self-emitting display apparatus. This invention is not limited to this embodiment. This invention is generally applicable to self-emitting display apparatuses having self-emitting devices to be driven with the control of current.

In the above embodiment, the n-type TFT is used as the switching element 208, and the p-type TFT as the driving control element 210. This invention is not limited to this embodiment. If the logic of control signals and the power supply voltage in the above embodiment are inverted, a p-type TFT may be used as the switching element 208 and an n-type TFT as the driving control element 210. If the setting of the logic of control signals and the power supply voltage is adjusted, TFTs of the same channel type may be used for the switching element 208 and driving control element 210.

In the above-described embodiment, one TFT is used as the driving control element 210. Alternatively, a current-controllable circuit may be used for the driving control element 210.

In the above embodiment, the polysilicon is used for the semiconductor layer of the TFT. Alternatively, non-single-crystal silicon such as micro-crystal silicon or amorphous silicon may be used for the semiconductor layer of the TFT.

In the above-described embodiment, the display pixel PX comprises three kinds of display devices 205 (R, G, B) arranged along the scan signal line 207. This invention is not limited to this embodiment. The three display devices 205 (R, G, B) may be arranged within the PX, as shown in FIGS. 7 and 8.

Figure 7:
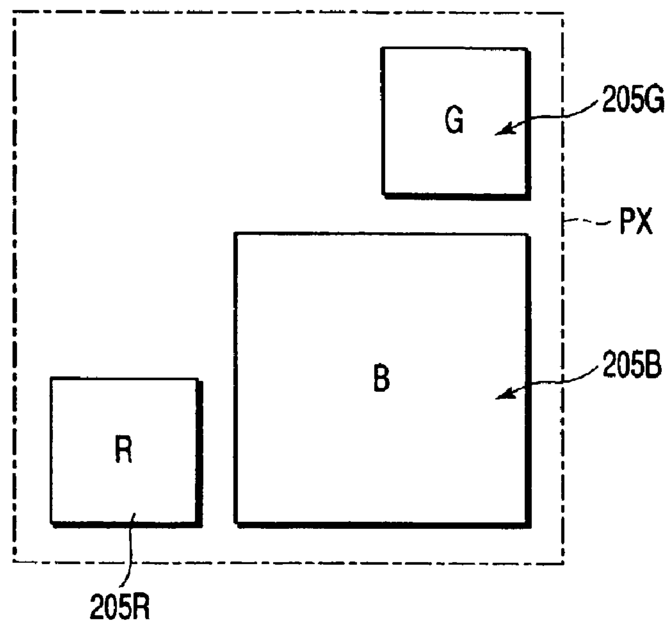
FIG. 7 shows another arrangement of the respective display devices within a display pixel PX.

In an example of arrangement of FIG. 7, one display device 205 (e.g. blue display device 205B) having a maximum light-emission area is disposed at a corner of the substantially square display pixel PX. The other two display devices 205 (e.g. red display device 205R and green display device 205G) having relatively small light-emission areas are disposed in a staggered fashion, that is, at other two diagonal corners. In the vicinity of the other corner, the switching element 208 or driving control element 210 for driving the three display devices may be disposed.

In the example of FIG. 7, two display devices (e.g. green display device 205G and blue display device 205B) are alternately arranged in one column along the video signal line 206. In an adjacent column, one display device (e.g. red display device 205R) is disposed. On the other hand, two display devices (e.g. red display device 205R and blue display device 205B) are alternately arranged in one row along the scan signal line 207. In an adjacent row, one display device (e.g. green display device 205G) is disposed.

Figure 8:
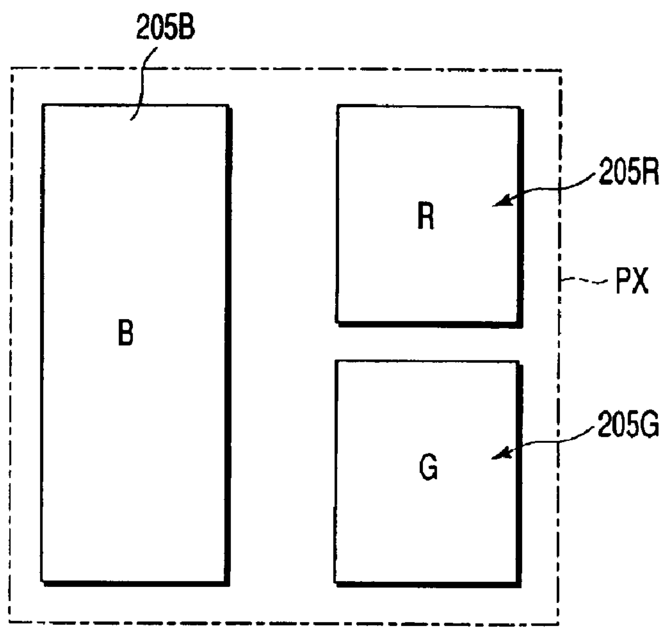
FIG. 8 shows still another arrangement of the respective display devices within the display pixel PX.

In an example of arrangement of FIG. 8, one display device 205 (e.g. blue display device 205B) having a maximum light-emission area is juxtaposed with the other two display devices 205 (e.g. red display device 205R and green display device 205G) having relatively small light-emission areas.

In the example of FIG. 8, one display device (e.g. blue display device 205B) having a maximum light-emission area is disposed in one column along a first signal line (e.g. video signal line 206). In an adjacent column, two display devices 205 (e.g. green display device 205G and red display device 205R) having relatively small light-emission areas are alternately arranged. On the other hand, two display devices 205 (e.g. red display device 205R and blue display device 205B) are alternately arranged in one row along a second signal line (e.g. scan signal line 207) perpendicular to the first signal line. In an adjacent row, two display devices 205 (e.g. green display device 205G and blue display device 205B) are alternately arranged.

With the arrangements shown in FIGS. 7 and 8, too, the same advantages as in the above-described embodiment can be obtained.

As has been described above, according to the present invention, the current densities for the display devices of the respective colors are optimized such that the luminance half-value periods of the respective display devices may be substantially equal. In addition, the light-emission areas of the display devices of the respective colors are determined so as to achieve the optimized current densities. Thus, a self-emitting display apparatus capable of suppressing a conspicuous variation in white balance with the passing of time can be realized. Moreover, a highly reliable self-emitting display apparatus capable of displaying high-quality color images can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A self-emitting display apparatus including a plurality of display pixels arranged in a matrix, each display pixel including a plurality of kinds of self-emitting devices that self-emit light components with different major wavelengths wherein a light-emission area of one of the plurality of kinds of self-emitting devices, which has a shortest luminance half-value period relative to the equivalent current density is larger than a light-emission area of another of the plurality of kinds of self-emitting device, which has a longest luminance half-value period relative to the equivalent current density, so that their luminance half-value periods become substantially equal to each other in the current density vs. luminance half-value period characteristics.

2. The self-emitting display apparatus according to claim 1, wherein said self-emitting device having the light-emission area which is larger than the light-emission area of the another self-emitting devices is one of a first self-emitting device that self-emits red light, a second self-emitting device that self-emits blue light, and a third self-emitting device that self-emits green light.

3. The self-emitting display apparatus according to claim 1, wherein said display pixel includes a first self-emitting device that self-emits red light, a second self-emitting device that self-emits blue light, and a third self-emitting device that self-emits green light.

4. The self-emitting display apparatus according to claim 1, wherein each of said self-emitting devices has an organic light-emitting layer between a pair of electrodes.

5. The self-emitting display apparatus according to claim 1, wherein a light-emission area of one of the plurality of kinds of self-emitting devices, which self-emits a shortest major wavelength light, is larger than each of light-emission areas of the other self-emitting devices.

6. The self-emitting display apparatus according to claim 1, wherein the light-emission areas are determined in inverse proportion to the current densities of each of the devices with which luminance half-value periods of the devices are substantially equal.

7. The self-emitting display apparatus according to claim 1, wherein one self-emitting device having a maximum light-emission area is disposed at a corner of a substantially square display pixel, and the other self-emitting devices are disposed at other two diagonal corners.

8. The self-emitting display apparatus according to claim 1, wherein one self-emitting device having a maximum light-emission area is juxtaposed with the other self-emitting devices.

* * * * *